(12) United States Patent
Volke et al.

(10) Patent No.: US 7,518,361 B2
(45) Date of Patent: Apr. 14, 2009

(54) NMR IMAGING METHOD AND DEVICE FOCUSING MAGNETIC FLUX TO A FOCAL POINT IN THE IMAGING VOLUME REGION

(75) Inventors: Frank Volke, St. Ingbert (DE); Martin Benecke, Homburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 10/514,942

(22) PCT Filed: May 30, 2003

(86) PCT No.: PCT/EP03/05714

§ 371 (c)(1),
(2), (4) Date: Nov. 18, 2004

(87) PCT Pub. No.: WO03/102617

PCT Pub. Date: Dec. 11, 2003

(65) Prior Publication Data

US 2006/0055404 A1    Mar. 16, 2006

(30) Foreign Application Priority Data

May 31, 2002  (DE) ................................ 102 24 192

(51) Int. Cl.
*G01V 3/00* (2006.01)
(52) U.S. Cl. ........................................ 324/307; 324/318
(58) Field of Classification Search ......... 324/300–322; 600/407–423
See application file for complete search history.

(56) References Cited

U.S. PATENT DOCUMENTS

| | | | | |
|---|---|---|---|---|
| 4,240,439 A | * | 12/1980 | Abe et al. | 600/412 |
| 4,307,343 A | * | 12/1981 | Likes | 324/307 |
| 4,740,753 A | * | 4/1988 | Glover et al. | 324/320 |
| 4,769,022 A | * | 9/1988 | Chang et al. | 604/368 |
| 4,875,485 A | * | 10/1989 | Matsutani | 600/415 |
| 5,160,888 A | * | 11/1992 | Laukien | 324/309 |
| 5,516,670 A | * | 5/1996 | Kuehnle et al. | 435/459 |

(Continued)

FOREIGN PATENT DOCUMENTS

DE   36 39 140 A1   5/1987

(Continued)

*Primary Examiner*—Brij B Shrivastav
*Assistant Examiner*—Tiffany A Fetzner
(74) *Attorney, Agent, or Firm*—Buchanan Ingersoll & Rooney PC

(57) ABSTRACT

The invention relates to an imaging NMR device and method in which an object is exposed to a stationary polarization field $B_0$ and an electromagnetic alternating field. Nuclear resonant processes are induced in said object detected as test signals, and are visually represented. The stationary magnetic polarization field has at least one spatially limited volume region inside said object. The spatially limited volume region has a greater magnetic flux density than the remaining region of said object so that said nuclear resonant processes are induced solely in said spatially limited volume region. The test signals from said nuclear resonant processes induced inside said limited volume region are detected and displayed. The spatial position of said limited volume region (4) is changed at least once in a controlled manner and said test signals are detected again from said positionally modified volume region.

16 Claims, 2 Drawing Sheets

U.S. PATENT DOCUMENTS

| | | | | |
|---|---|---|---|---|
| 6,037,771 | A * | 3/2000 | Liu et al. | 324/309 |
| 6,114,851 | A * | 9/2000 | Kruspe et al. | 324/303 |
| 6,208,142 | B1 * | 3/2001 | Wagshul | 324/319 |
| 6,218,833 | B1 * | 4/2001 | Kruspe et al. | 324/303 |
| 6,307,373 | B1 * | 10/2001 | Young | 324/322 |
| 6,320,381 | B1 * | 11/2001 | Hennig | 324/312 |
| 6,445,181 | B1 * | 9/2002 | Pelc et al. | 324/307 |
| 6,492,810 | B1 * | 12/2002 | Hajnal | 324/309 |
| 6,650,116 | B2 * | 11/2003 | Garwood et al. | 324/309 |
| 6,700,372 | B2 * | 3/2004 | Blumich et al. | 324/307 |
| 6,714,011 | B1 * | 3/2004 | Aldefeld et al. | 324/318 |
| 6,794,869 | B2 * | 9/2004 | Brittain | 324/309 |
| 6,801,034 | B2 * | 10/2004 | Brittain et al. | 324/309 |
| 6,801,035 | B2 * | 10/2004 | Wang | 324/309 |
| 6,828,790 | B2 * | 12/2004 | Katscher et al. | 324/318 |
| 6,853,190 | B2 * | 2/2005 | Nittka et al. | 324/309 |
| 6,891,374 | B2 * | 5/2005 | Brittain | 324/309 |
| 6,897,655 | B2 * | 5/2005 | Brittain et al. | 324/309 |
| 6,927,574 | B2 * | 8/2005 | Young et al. | 324/318 |
| 2002/0079891 | A1 * | 6/2002 | Blumich et al. | 324/307 |
| 2003/0155917 | A1 * | 8/2003 | Young et al. | 324/318 |
| 2006/0055404 | A1 * | 3/2006 | Volke et al. | 324/307 |

FOREIGN PATENT DOCUMENTS

| | | |
|---|---|---|
| DE | 199 39 626 A1 | 3/2001 |
| EP | 0 228 154 | 7/1987 |
| GB | 2360093 A * | 9/2001 |
| WO | WO 01/67125 A1 * | 9/2001 |

* cited by examiner

NMR IMAGING METHOD AND DEVICE FOCUSING MAGNETIC FLUX TO A FOCAL POINT IN THE IMAGING VOLUME REGION

TECHNICAL FIELD

The present invention relates to an imaging NMR process in which a to-be-examined object is exposed to a stationary magnetic polarization field $B_0$ and an electromagnetic alternating field, and in which nuclear resonant processes, which are detected as test signals and visually represented, are induced in the object. Furthermore, a NMR device is disclosed.

BACKGROUND OF THE INVENTION

NMR imaging processes and respective devices are used, i.a., for non-destructive examination of the material and the structure of objects composed of crystalline, glass-like materials or of soft materials, such as for example elastomers, or of liquids or biological materials.

A prior art NMR process and a respective device is disclosed in DE 199 39 626 A1, in which a portable NMR device is described with reference to FIGS. 3a and 3b. This prior art device comprises two permanent magnets which are spaced a distance apart and serve to generate a stationary magnetic polarization field. A high-frequency coil arrangement and two gradient coils are provided between the permanent magnets. The two gradient coils serve to generate a magnetic gradient field superposing on the stationary magnetic polarization field. The magnetic gradient field is operated an intermittently pulsed manner for locally resolved NMR measurement.

With the aid of the high-frequency coil arrangement, which, in addition to generating the high-frequency alternating field, simultaneously acts as a reception coil, high-frequency signals generated by the nuclear resonant processes occurring inside the sample, are received and visually represented by means of an evaluation unit. The nuclear resonant processes occurring inside the sample are predominantly due to the nuclear spin interaction of the hydrogen atoms with the stationary magnetic polarization field based on the selective high-frequency energy excitation by the high-frequency alternating field and can be put in a very remote sense in relation to the hydrogen concentration present inside the examined sample volume in the evaluation.

Although the NMR device described in the preceding when built as a portable device permits planar examination of an object by running over the surface of the object, the to-be-analyzed object volume is limited to only a very shallow depth of penetration of a few millimeters due to the magnetic fields generated by the NMR device. With certainty the penetration depth into the to-be-examined object could be improved by dimensioning the permanent magnets employed correspondingly larger. However, such scaling measures influence the actual magnetic depth of penetration only insignificantly. Moreover, the larger and thus heavier permanent magnets make the NMR device impossible to use as a portable device.

Furthermore, for locally resolved NMR analysis, the NMR system described in the preceding requires gradient coils to generate magnetic gradient fields, which requires complicated activation, thus entailing technically complicated test-signal inducement.

In order to reduce the complexity of the apparatus of the NMR system, DE 36 39 140 A1 proposes reducing the volume region of the stationary magnetic polarization field due to which, however, the magnetic field does not penetrate the entire to-be-examined patient but only a section. The stationary magnetic polarization field is generated with the aid of a Helmholtz double magnetic system, leading to tapered bundling of the magnetic field lines with increased magnetic flux density. The to-be-examined patient is positioned in this tapered region of the magnetic field lines. In order to examine the whole patient, the patient is placed in a moveable manner in relation to the magnetic system. In this case, too, the magnetic resonance system described in this printed publication provides a gradient coil arrangement for local resolution of the measuring points within the tapered region of the magnetic field lines.

EP 0 228 154 A2 describes a magnetic arrangement comparable to the preceding magnetic resonance system. This magnetic arrangement shows a double magnetic arrangement suited for NMR purposes. In order to reduce magnetic losses due to so-called magnetic field leakage, the magnetic arrangements are each provided with a concave-designed top side facing each other, which also makes the magnetic lines assume a tapered field shape between the magnetic arrangements. In this instance, however, additional gradient fields are required in order to permit local resolution when examining samples.

DESCRIPTION OF THE INVENTION

Based on the described prior art, the object of the present invention is to provide a NMR method and a corresponding device that permits far greater penetration depth into an object-to-be-analyzed and, moreover, permits portable use of the NMR device. In addition, it should be possible to realize locally resolved test signal inducement with a much less complicated device as well as much less complicated measuring.

The solution to the object of the present invention is set forth in claim 1, which describes an imaging NMR method. The subject matter of claim 9 is a NMR device according to the present invention. Advantageous features that further develop the inventive idea are the subject matter of the sub-claims.

According to the invention, a generic imaging NMR method according to the introductory part of claim 1 is designed in such a manner that the magnetic polarization field is provided with at least one spatially limited volume region inside the object, in which the magnetic flux density is larger than in the remaining portion of the object. Nuclear resonating processes are induced inside the limited volume region, which produces locally test signals which are detected with the aid of a reception unit. The field conditions generated inside the volume region ensure inducement of the nuclear resonant processes solely inside the limited volume region, whereas outside the volume region, no such processes occur or at least not to a measurable degree. In an advantageous manner, information relating to the spatial position of the volume region is added to the test signals corresponding to the volume region. In a further step, the spatial position of the volume region relative to the otherwise resting object is changed and then test signals are again detected from the positionally modified volume region. The change in position occurs in a controlled manner thereby ensuring that determination of the spatial position of the respective measured volume region is always possible. Position change of the measured volume region is repeated as often as desired until, for example, the entire object volume has been measured and reconstruction of the entire object is possible from a multiplicity of signal measurements. Measurement of the object can, of course, also be limited to measuring single partial regions.

The advantage of the invented method is primarily to be seen in that the entire to-be-measured object volume is measured and analyzed in successive single NMR measuring steps. In each single measuring step, the measuring conditions required for successful NMR measurement need only be established in a spatially narrowly limited volume region within which the energy conditions regarding magnetic flux density and high-frequency field intensity required for nuclear resonant processes must be met. In other words, contrary to the prior art, nuclear resonant process conditions need not be established in the entire active region of the stationary magnetic polarization field but only in a narrowly limited volume region, the so-called voxel. This has the advantage that the spatial concentration of the magnetic field lines inside a volume region permits much greater detectable measuring penetration depth into a to-be-examined object with the same energy input compared to prior art methods.

In contrast to the prior art magnetic arrangements with which magnetic field lines cannot be concentrated on a spatially limited, i.e. spatially closed off, volume region, the method according to the present invention provides a selective concentration of magnetic field lines on a spatially completely limitable spatial region whose spatial position can already be determined with the aid of the concentration method without using additional gradient fields.

If the high-frequency field for nuclear spin resonant excitation is assumed as given respectively as constant, the magnetic flux density within the spatially limited volume region must be selected in a certain manner in order to fulfill the so-called Larmor frequency condition in which the resonance absorption occurs among the spin-aligned nuclei relative to the stationary magnetic polarization field. In particular, the following condition applies for the resonance condition:

$$h \times f = \mu \times H,$$

with h=Planck's constant, f=the resonance frequency of the high-frequency field, $\mu$=the magnetic susceptibility of the object material and H=the magnetic field strength.

The magnetic flux density within the spatially limited volume region is, therefore, to be selected in such a manner that inside the volume region, the magnetic flux density and therefore the stationary magnetic polarization field $B_0$ corresponds to the abovementioned resonance condition. A smaller magnetic flux density prevails in all the other regions of the object so that no nuclear resonant processes or no nuclear resonant processes worth mentioning are observed.

In a preferred embodiment of the invented method, the stationary magnetic polarization field is generated by superposition of single magnetic polarization fields. The reciprocal spatial orientation of the many magnetic single fields, which each possess magnetic field lines that are aligned in relation to each other, are oriented in such a manner in relation to each other that they structurally superpose each other each other in a limited volume region to form a locally heightened magnetic flux density.

Alternatively or in combination with the so-called superposition principle for formation of spatially limited magnetic field maxima, local increases in the magnetic flux density can be obtained by focussing the magnetic field lines.

For example, by using focussing devices for magnetic field lines, so-called magnetic focussing lens systems, the magnetic field lines can be bundled in the "focal point" of the focussing device.

Moreover, a particular advantage is to change the spatial position of the volume region. In the example using a multiplicity of single magnetic units, this can be done by correspondingly changing the spatial position of the single magnetic units. In an especially advantageous preferred embodiment, for this purpose the individual magnetic units are located on the concave side of a parabolic area to which a focal point, in which the individual magnetic fields structurally superpose each other each other, can be allocated according to the principles of geometric optics. For example, changing the curvature behavior of the parabolic area changes the position of the focal point and thus the spatial position of the volume region.

Selective sequential changes in the position of volume region permits in this manner measuring the entire volume region of the object. Finally by using suited evaluation programs, an image of the entire object can be produced mosaic-like from the multiplicity of singly measured volume regions by means of superposition, respectively by means of assembly.

In addition to the much greater depth of penetration achievable by the superposition from a multiplicity of individual magnetic fields within a to-be-examined object or by corresponding focussing of the magnetic lines, the invented methods obviates the necessity of providing magnetic gradient fields for location resolution of test signals as the location information can already be derived from the superposition principle, respectively from magnetic focussing. For example, the spatial arrangement of the multiplicity of magnetic units can be altered in a desired manner by using suited control elements so that the position of the focal point determined by the overall arrangement of the magnetic units can be changed in a defined manner.

Such type control elements can be constructed in a variety of ways, for example as piezo-control elements or as hydraulically regulatable control elements with which, for example, the shape of a carrier matrix on which the individual magnetic units are placed can be changed in a controlled manner. Furthermore, the coils in a defined array arrangement on the carrier matrix can be selectively actuated respectively activated for field generation.

With the aid of the NMR device designed according to the present invention, volume regions inside an object can be discriminatingly selected and test signals which can be used for local spectroscopy can be received from these areas. Furthermore, non-destructive material control as well as quality control, respectively analyses, can be conducted. A programmable sequence for measuring individual volume regions, for example in longitudinal direction of a line or corresponding combination of a multiplicity of such lines permit measuring and visually representing larger volumina of the object. Moreover, the invented method permits construction of a NMR device in dimensions allowing use of the device as a portable unit. Such a type NMR device can be employed for a multiplicity of field of applications, for example for examining materials and objects in biotechnology, agriculture and forestry, building material science, etc.

BRIEF DESCRIPTION OF THE DRAWINGS

The present invention is made more apparent by way of example in the following using preferred embodiments with reference to the accompanying drawings without the intention of limiting the overall inventive idea.

WAYS TO CARRY OUT THE INVENTION, COMMERCIAL APPLICABILITY

Figure 1:
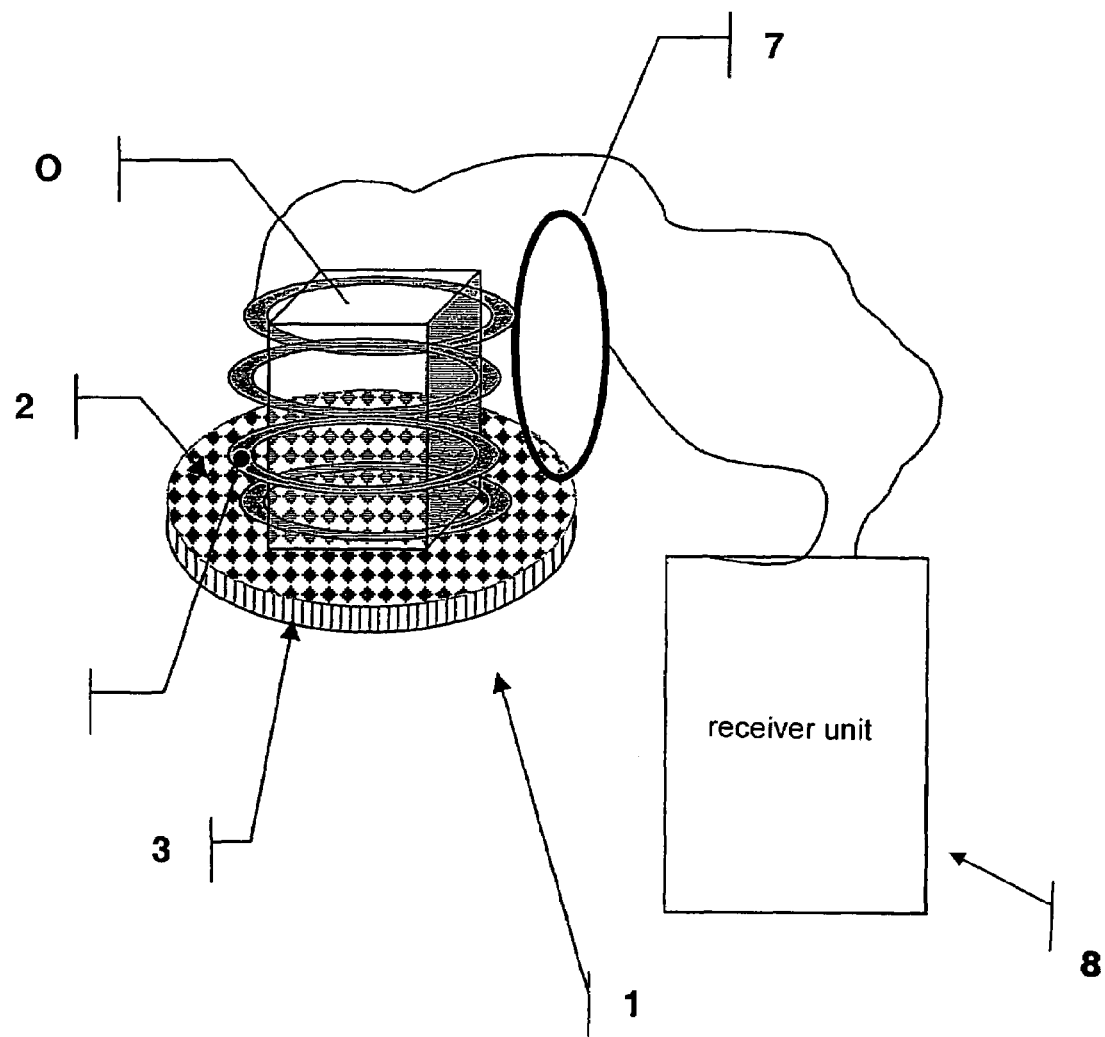
FIG. 1 shows a schematic representation of a NMR device.
Figure 2:
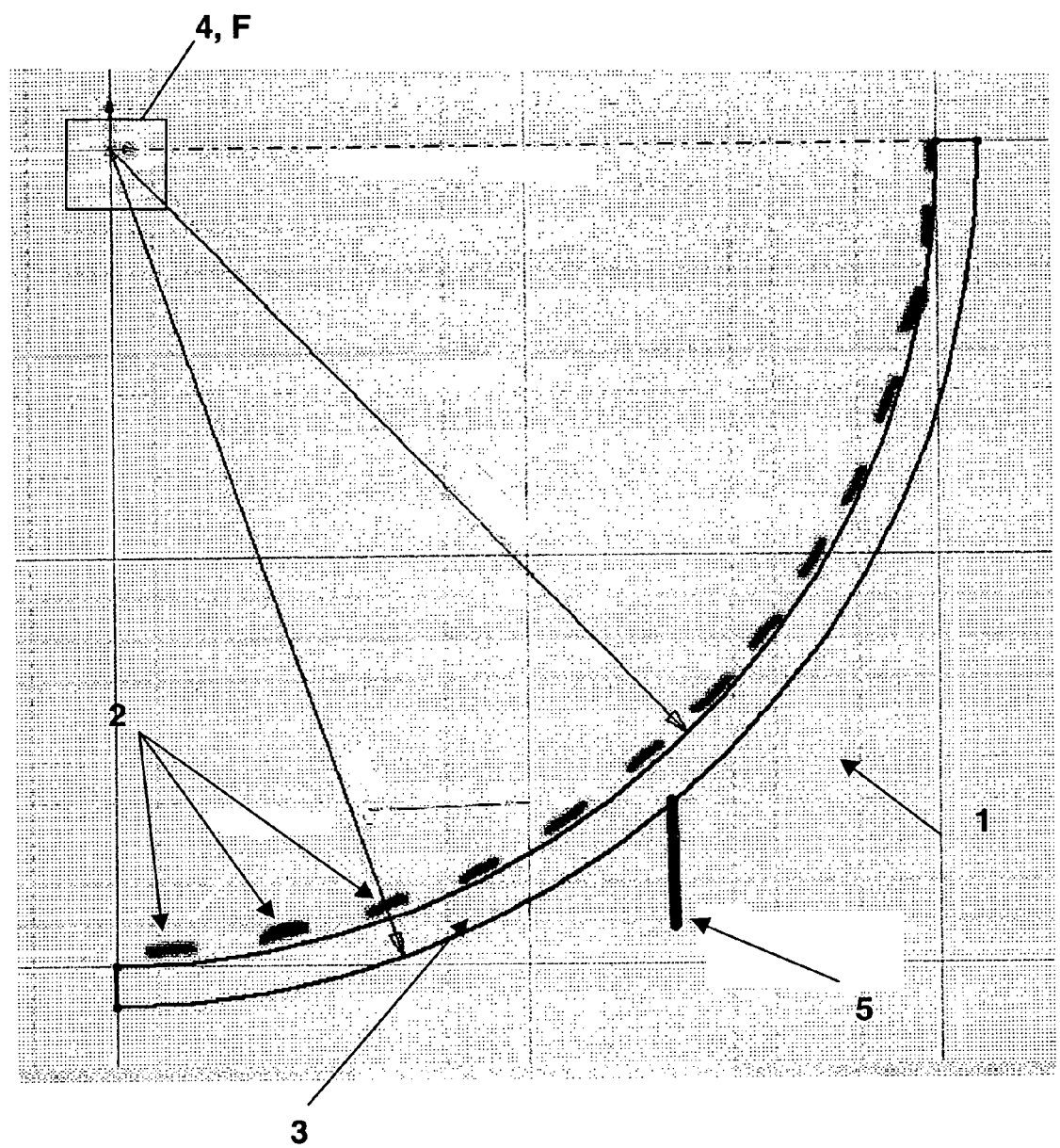
FIG. 2 shows a detail representation of an arrangement of magnetic units on a paraboloid.

The aim of FIGS. 1 and 2 is to examine in a non-destructive manner a schematically represented object O with the aid of a nuclear spin resonant method. For this purpose, a stationary magnetic polarization field $B_O$ generated by a magnetic field generating unit 1 is required.

FIG. 2 illustrates a preferred embodiment according to figure, FIG. 2 shows that the magnetic arrangement 1 comprises a multiplicity of magnetic units 2 arranged on the concave side of a parabolically shaped area 3, the so-called carrier matrix (see FIG. 2). The carrier matrix can, of course, be constructed in different geometric shapes showing focal imaging behavior, for example spherical or cylindrical planar shapes.

Due to the spatial design of the parabolically shaped carrier matrix 3, the magnetic fields of the individual magnetic units 2 superpose each other each other in the volume region 4, which is, assuming the principles of geometric optics, disposed in the focal point F of the parabolically shaped carrier matrix 3. The volume region 4, referred to as voxel, possesses volume values of down to 1 µl, thereby permitting local resolution of the measurements down to the µm range, which is made possible by employing magnetic fields which superpose each other.

Corresponding modification of the concave side surface curvature of the carrier matrix 3 changes the spatial position of the focal point F and thus the volume region 4, in which, due to superposition, the magnetic fields of the individual magnetic units 4 superpose each other structurally. Modification of the spatial shape of the carrier matrix 3 occurs with the aid of a control means 5 designed as a hydraulic actuator. The control means 5 can also be realized by piezoelectric elements.

With reference to the preferred embodiment according to FIG. 1, the to-be-examined object O is located inside that spatial region in which the volume region 4, as shown in FIG. 2, can be positioned in a controlled manner by corresponding activation of the magnetic arrangement 1. In order to conduct a NMR examination, object O is exposed to an electromagnetic high-frequency volume coil 6 or a suitably designed surface coil 7. The test signals that can be generated based on the spatial position of the volume region 4 inside object O and on the resonance conditions (Larmor frequency condition) prevailing therein are also detected via the coil unit 6, respectively 7, generating the electromagnetic high-frequency alternating field and are correspondingly amplified and evaluated with the aid of a receiver unit 8 and finally visually represented on an imaging unit.

Activation of the change in the position of the individual magnetic units 2 can also occur with the aid of receiver unit 8, thereby defining the spatial position of the volume region 4.

Corresponding successive scanning of the object O in the aforedescribed manner permits non-destructive measuring and visual representation of the entire volume. The invented NMR device can be preferably executed as a portable system and can be used in situ in the field. Thus, the invented device permits for the first time measuring in situ any kind of object, regardless whether of living or non-living nature. For example, the interior of a tree can be measured by placing all the components required for measurement around the tree. Moreover, due to the small measuring volume, spectroscopic examination can be conducted on the measuring object, for example inside a tree.

List of Reference Numbers 1 magnetic arrangement
2 magnetic units
3 area, carrier matrix
4 volume region, voxel
5 control element
6 high-frequency coil, volume coil
7 high frequency coil, surface coil
8 receiver unit

What is claimed is:

1. A nuclear magnetic resonance imaging method comprising:
   generating magnetic field lines through a plurality of single magnetic units arranged on a circumferential perimeter of a concave surface;
   focusing the magnetic field lines to a focal point in a volume region;
   applying an electromagnetic alternating field exposing an object in order to generate test signals in the volume region;
   detecting the test signals at a receiver unit; and
   displaying the test signals on an imaging unit.

2. An imaging NMR method in which a to-be-examined object is exposed to a stationary polarization field $B_0$ and to an electromagnetic alternating field, said stationary polarization field $B_0$ is generated by single magnetic units disposed on a circumferential perimeter of a parabolically shaped area, and nuclear resonant processes which are detected as test signals and are visually represented are induced in said object, wherein said stationary magnetic polarization field is provided with at least one spatially limited volume region inside said object, said spatially limited volume region having a greater magnetic flux density than the remaining region of said object so that said nuclear resonant processes are induced solely in said spatially limited volume region, said test signals from said nuclear resonant processes induced inside said limited volume region are detected, and the spatial position of said limited volume region is changed at least once in a controlled manner and said test signals are detected again from said positionally modified volume region;
   wherein a heightened magnetic flux density in said spatially limited volume region is generated by focusing a multiplicity of magnetic polarization fields to a focal point within said spatially limited volume region.

3. The method of claim 2 wherein said single magnetic units adjust the spatial position of the volume region in the object.

4. The method according to claim 2, wherein said stationary magnetic polarization field $B_0$ is generated by superposition of individual magnetic polarization fields.

5. The method according to claim 4, wherein the individual magnetic polarization fields superpose each other in such a manner that their magnetic lines are aligned in relation to each other.

6. The method according to claim 2, wherein said magnetic flux density prevailing inside said volume region and said electromagnetic alternating field active in said volume region are attuned to each other in such a manner that said nuclear resonant processes are solely induced inside said volume region.

7. The method according to claim 2, wherein for measuring the entire said object said spatially limited volume region acting as the measuring volume is positioned iteratively inside said entire object volume, and the entire representation of said object is reconstructed by assembling the allocatable measuring results from a multiplicity of single volume regions.

8. The method according to claim 4, wherein the individual said magnetic polarization fields to be superposed by means of superposition are generated by means of an array arrangement of electromagnetic single magnets which are supplied singly or in groups with electric energy.

9. The method according to claim 2, wherein said spatially limited volume region possesses a value of about 1 µl or greater.

10. An NMR imaging device comprising a magnetic arrangement generating a stationary magnetic polarization field $B_0$, a high-frequency arrangement for generating an electromagnetic alternating field superposing with said magnetic polarization field $B_0$ and a receiver unit for receiving test signals which are correlated with the nuclear resonant processes induced inside said magnetic polarization field $B_0$, wherein said magnetic arrangement comprises a multiplicity of single magnetic units which are spatially arranged in such a manner that the magnetic polarization fields of said magnetic units superpose with each other by means of superposition to form one entire magnetic polarization field in which at least one spatially limited volume region is present in which a greater magnetic flux density prevails than in the remaining region of said entire magnetic polarization field, wherein each of said single magnetic units are disposed on a circumferential perimeter of a parabolically shaped area.

11. The NMR device according to claim 10, wherein said single magnetic units are disposed planarly side by side and are aligned in relation to each other in such a manner that the magnetic polarization fields resulting from said single magnetic units concentrate in a spatially limited volume region.

12. The NMR device according to claim 10, wherein the spatial arrangement of said multiplicity of single magnetic units can be changed in a controlled manner.

13. The NMR device according to claim 10, wherein said parabolically shaped area can be changed in a controlled manner.

14. The NMR device according to claim 10, wherein said magnetic unit is a permanent magnet and/or an electromagnet.

15. The NMR device according to claim 10, wherein said magnetic units are electromagnets which can be singly activated to generate magnetic fields.

16. The NMR device according to claim 15, wherein said electromagnets are disposed array-like and are impinged with coil currents of varying strength to yield a focal effect regarding the magnetic polarization field generated by said electromagnets.

* * * * *